(12) United States Patent
Alexis et al.

(10) Patent No.: US 6,260,103 B1
(45) Date of Patent: *Jul. 10, 2001

(54) READ-WHILE-WRITE MEMORY INCLUDING FEWER VERIFY SENSE AMPLIFIERS THAN READ SENSE AMPLIFIERS

(75) Inventors: Ranjeet Alexis, Folsom; Robert E. Larsen, Shingle Springs, both of CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 105 days.

(21) Appl. No.: 09/002,645

(22) Filed: Jan. 5, 1998

(51) Int. Cl.[7] .............................. G06F 15/16; G06F 15/76
(52) U.S. Cl. ........................ 711/103; 711/155; 711/171; 365/230.03; 365/185.11
(58) Field of Search .................................. 711/155, 153, 711/166, 171, 173, 168, 103, 104; 365/205, 230.03, 185.33, 185.11, 189.04

(56) References Cited

U.S. PATENT DOCUMENTS

| | | | |
|---|---|---|---|
| 5,245,572 | 9/1993 | Kosonocky et al. | 365/189 |
| 5,361,227 * | 11/1994 | Tanaka et al. | 365/189.01 |
| 5,361,343 | 11/1994 | Kosonocky et al. | 395/425 |
| 5,426,603 * | 6/1995 | Nakamura et al. | 365/149 |
| 5,483,486 | 1/1996 | Javanifard et al. | |
| 5,537,361 * | 7/1996 | Ooishi. | |
| 5,572,466 | 11/1996 | Sukegwa. | |
| 5,590,074 * | 12/1996 | Akaogi et al. | 365/185.22 |
| 5,625,595 * | 4/1997 | Ikeda | 365/194 |
| 5,648,929 | 7/1997 | Miyamoto | 365/185.04 |
| 5,708,603 * | 1/1998 | Tanaka. | |
| 5,732,030 * | 3/1998 | Dorney | 365/200 |
| 5,748,528 | 5/1998 | Campardo et al. | 365/185.13 |
| 5,751,634 * | 5/1998 | Itoh | 365/185.17 |
| 5,796,657 * | 8/1998 | Lee et al. | 365/185.11 |
| 5,818,785 * | 10/1998 | Ohshima | 365/230.03 |
| 5,835,966 * | 11/1998 | Ooishi. | |
| 5,862,095 * | 1/1999 | Takahashi et al.. | |
| 5,867,430 * | 2/1999 | Chen et al. | 365/189.04 |
| 5,875,132 * | 2/1999 | Ozaki. | |
| 5,917,744 * | 6/1999 | Kirihata et al. | 365/63 |
| 5,936,884 * | 8/1999 | Hashbun et al. | 365/185.03 |
| 5,940,329 * | 8/1999 | Seitsinger et al.. | |
| 5,949,713 * | 9/1999 | Bedarida et al. | 365/185.11 |
| 6,011,720 * | 1/2000 | Tanaka. | |

OTHER PUBLICATIONS

International Seach Report, PCT/US98/25217, 5 pages.

* cited by examiner

Primary Examiner—Mark H. Rinehart
Assistant Examiner—Stephan Willett
(74) Attorney, Agent, or Firm—Cynthia T. Faatz

(57) ABSTRACT

A read-while-write memory device. The read-while-write memory device includes a read memory plane and a write memory plane. A first number of read sense amplifiers greater than one is coupled in parallel to the read memory plane in response to a memory read operation. A second number of verify sense amplifiers greater than zero and less than the first number is coupled to the write memory plane in response to one of a memory write or erase operation.

25 Claims, 4 Drawing Sheets

READ-WHILE-WRITE MEMORY INCLUDING FEWER VERIFY SENSE AMPLIFIERS THAN READ SENSE AMPLIFIERS

FIELD OF THE INVENTION

The present invention relates generally to memory devices and more particularly to the configuration and use of sense amplifiers for memories in which read and write operations can be performed simultaneously.

BACKGROUND OF THE INVENTION

There are many different types of memory devices available today with a wide range of capabilities and operating characteristics. As with many other types of integrated circuit devices, there is a focus on increasing memory device performance, speed, and utility while reducing or maintaining power consumption at a low level.

Flash memory, an increasingly popular type of memory, is a nonvolatile memory that is electrically erasable and electrically programmable. In many cases, flash memories are now being used for functions traditionally provided by Electrically Erasable Programmable Read Only Memories (EEPROMS) and Static Random Access Memories (SRAMs). Such applications include Basic Input/Output System (BIOS) memories, for example. Other applications for flash memory include cellular telephones, other personal computer memories, automotive and airplane control, handheld communications devices, and digital cameras.

Further, flash memory can be used to store both code and data. In a cellular phone application, for example, a flash memory can be used to store factory data, operating routines, user data, and system and network data.

In a flash memory, as in other types of memories, there are three basic types of memory access operations: a program (also referred to as write) operation, an erase operation, and a read operation.

In currently available flash memories, each of the different memory operations requires a different amount of time to perform. For example, in some current flash memories, a read operation may take approximately 100 nanoseconds to perform, while a program operation may require about 10 microseconds and an erase cycle may take as long as one second to perform.

The difference between the time required for erase and program cycles and the time required for a read cycle is significant. Therefore, it is useful to be able to perform read operations concurrently with performing either program or erase operations. In this manner, read operations do not have to be stalled while waiting for program or erase operations to complete and program or erase operations do not have to be suspended in order that speed critical read commands can be serviced.

A flash memory or other memory that is capable of performing read operations while program and/or erase cycles are being performed in the background is referred to as a "read-while-write" (RWW) memory. A RWW memory provides increased efficiency and speed, along with other advantages.

For example, in some prior systems, multiple memories are provided such that read and write or program operations can be performed concurrently. With the use of memories that include RWW capability, it may be possible to achieve the same system performance using only one memory. RWW memories also facilitate increasingly important multitasking capabilities.

In order to be able to perform read and program or erase cycles concurrently on a single flash memory device, some additional circuitry must be provided. For example, sense amplifiers, also referred to as sense amps, are used to detect the values stored in particular flash cells during a read operation. Typically, 8 or 16 flash memory cells are read at one time. The number of flash memory cells read at one time for a particular flash memory is referred to as the number of internal reads possible. To enable this parallel read operation, a same number of sense amplifiers as the number of flash memory cells to be read is provided. For example, if sixteen flash memory cells are to be read during a read operation, sixteen sense amplifiers are available for the read operation.

While sense amplifiers are not required for the actual programming or erasing operations, a verify step following each program or erase operation does use sense amplifiers. The verify operation is similar to a read operation and is used to verify the success of a program or erase operation.

Several flash memory cells are also often programmed and verified in parallel as described above in reference to the read operation. Typically, for a given flash memory, a verify operation reads the same number of memory cells in parallel as are read during a read operation. For this reason, some currently available RWW memories include and use twice the number of sense amplifiers as the number of flash memory cells that are read during a read operation such that read and verify operations can be performed simultaneously. In the example provided above in which a read operation to the flash memory array causes sixteen flash memory cells to be read at a time, such prior memories use 32 sense amplifiers in order to be able to perform read operations concurrently with program and/or erase operations.

A disadvantage associated with current RWW memories is that significant additional space on the integrated circuit is required to implement RWW functionality. Some of this additional space is due to the number of additional sense amplifiers required to be able to perform a read operation concurrently with a write and/or erase operation.

Another disadvantage associated with current RWW memories is that the additional sense amplifiers provided to perform the read and verify operations concurrently increase the peak power consumption of the memory as compared to similar memories without RWW capability.

The additional silicon space and power required to implement RWW functionality is a drawback in today's power electronics applications that are sensitive with respect to power, cost and space.

SUMMARY OF THE INVENTION

A read-while-write (RWW) memory device comprises a memory array including a read memory plane and a write memory plane. The RWW memory also includes a first number of read sense amplifiers to be coupled in parallel to the read memory plane in response to a memory read operation wherein the first number is greater than one. The RWW memory also includes a second number of verify sense amplifiers to be coupled to the write memory plane in response to one of a memory write or erase operation wherein the second number is greater than zero and less than the first number.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A read-while-write memory including multiple sense amplifiers for read operations and fewer sense amplifiers for verify operations is described. Although the following embodiments are described with reference to a flash memory, alternative embodiments are also applicable to other types of memories that are capable of performing read operations from one area of a memory device or array while concurrently performing program or erase and verify operations in another area of the memory array.

An intended advantage of one or more embodiments described below is reduced instantaneous power consumption for memory devices that have read-while-write (RWW) capabilities. Another intended advantage of one or more embodiments described below is a reduction in the amount of additional integrated circuit space required to implement read-while-write capability. Further, for some embodiments, noise and its effects may be reduced during sensing.

As will be described in more detail below, for one embodiment a memory array in a memory device providing RWW functionality includes a read memory plane and a write memory plane. A plurality of read sense amplifiers are simultaneously coupled to the read memory plane during a memory read operation, while a single verify sense amplifier is coupled to the write memory plane during a verify operation following a memory write or erase operation. Thus, several locations of the read memory plane of the memory array are read in parallel for a read operation while memory locations in the write memory plane are verified serially for a program or erase verify operation.

Figure 1:
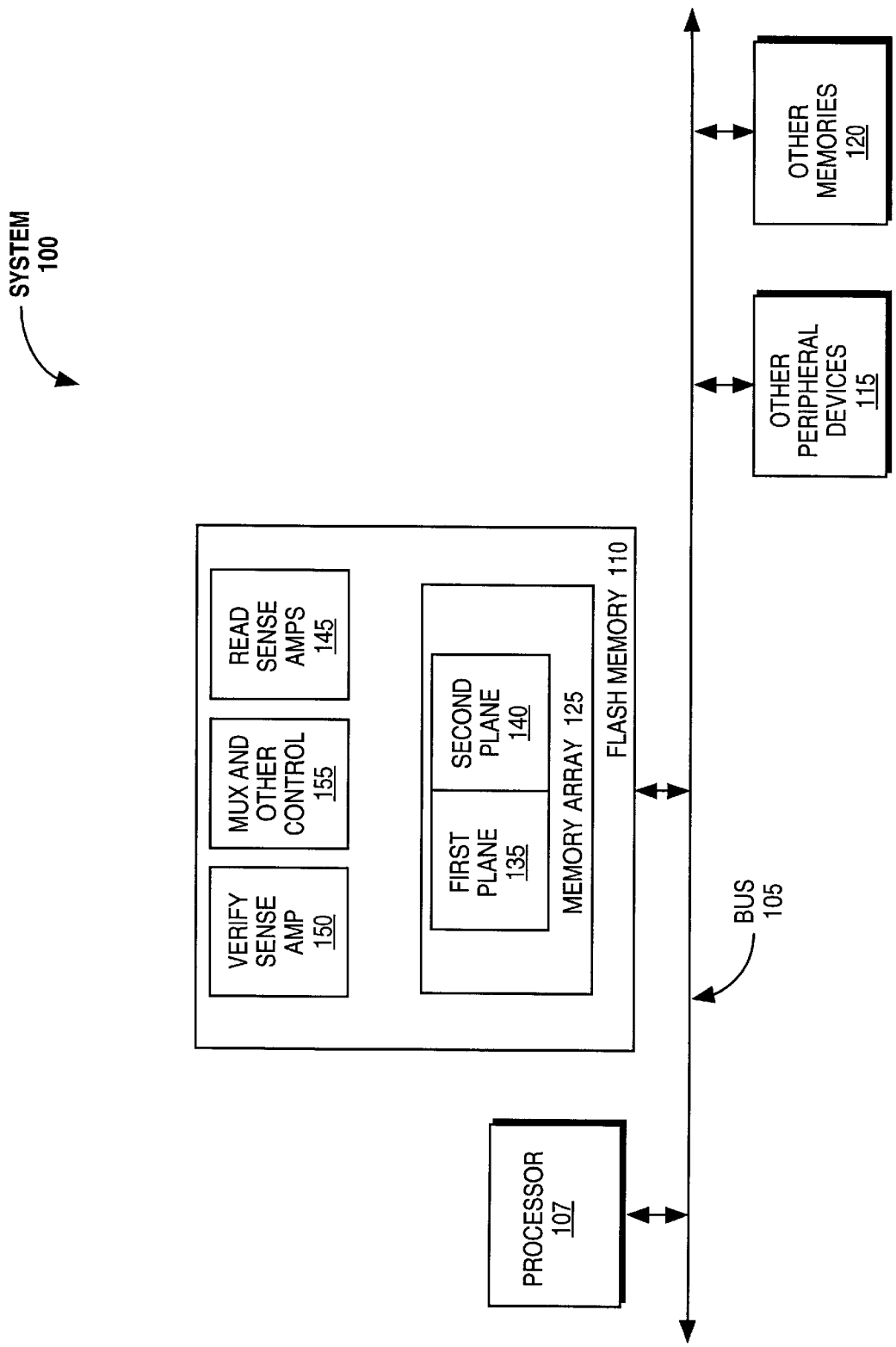
FIG. 1 shows an example of a system including a read-while-write flash memory of one embodiment.

FIG. 1 shows a block diagram of a system 100 in which one embodiment may be implemented. The system 100 may be a computer system, a cellular phone, an engine control system, or a digital camera, for example. Other types of systems may also benefit from use of the present invention.

The system 100 of FIG. 1 includes a system bus 105, a processor 107 coupled to the system bus 105, and a flash memory 110, also referred to as a flash electrically programmable read only memory (EPROM) also coupled to the system bus 105. The system 100 may include other peripheral devices 115 coupled to the system bus 105 such as an input and/or output device, for example. The system 100 may also include other memories 120 such as a static random access memory (SRAM), a mass storage device, or a read-only memory (ROM).

The flash memory 110 includes a memory array 125 including a first plane 135 and a second plane 140. The first and second planes 135 and 140 include different physical memory locations in a contiguous memory array 125 formed on a single substrate for one embodiment. For an alternate embodiment, the first and second memory planes are each located on a different integrated circuit device. For another alternate embodiment, each of the first and second memory planes are located on a single integrated circuit die, but are separated by other circuitry.

One of the first or second planes 135 or 140 is selected to be a read plane for each memory access operation while the other plane is selected to be a write plane. Memory read operations may be performed to the read plane concurrently with the performance of memory erase or memory write (program) operations directed to the write plane. The read plane alternates between the first plane 135 and second plane 140 depending on the address of memory locations to be read during a read operation and/or depending on the plane that has been selected to be the write plane. The plane that is not selected to be the read plane is the write plane for one embodiment and vice versa.

At any point in time, the area of the memory array 125 that is selected to be the read plane can only be accessed for memory read operations while the area of the memory array 125 that is selected to be the write plane can only be accessed for memory write, erase or verify operations.

Also, for one embodiment, the first and second planes 135 and 140 are equal in size. For alternate embodiments, however, one of the first or second planes is larger than the other. Further, for alternate embodiments, there may be more than two planes in the memory array 125 such that for any memory access operation, one or more planes may be designated as read planes while the remaining one or more planes may be selected to be write planes.

The planes of one embodiment, for example, may be configured in the manner described in copending U.S. patent application Ser. No. 09/002,649 entitled "Flash Memory Partitioning for Read-While-Write Operation", Attorney docket number 042390.P4715, filed on the same date and assigned to the same assignee as the present application.

The flash memory 110 also includes read sense amplifiers (sense amps) 145, a verify sense amp 150, a multiplexor (mux) and other control circuitry 155. The read sense amps for one embodiment include a same number of read sense amps as the number of flash memory cells in a row of memory. For another embodiment, the read sense amps 145 include the same number of read sense amps as the number of memory cells that are read at once during a read operation to the memory array 125. For the example shown in FIGS. 1–3, 16 memory cells are read at one time for the flash memory 110, therefore, the read sense amps 145 include 16 sense amps. This number may be referred to as the burst length.

The read sense amps 145 are coupled to the read plane during a memory read operation such that, for one embodiment, all of the memory cells to be read during a single read cycle can be read in parallel. For embodiments in which the number of read sense amps is equal to the number of memory cells in a row of memory, an entire row can be read in parallel.

The verify sense amp 150 for one embodiment includes a single sense amp. The verify sense amp 150 is coupled to the write plane during a verify operation following a memory erase or memory write operation directed to the write plane. A write verify or erase verify operation is performed in a serial manner using the single verify sense amp 150. That is to say, the single verify sense amp 150 is used to perform a verify operation one memory cell (one bit) at a time.

For other embodiments, a larger number of verify sense amps may be provided. The number of verify sense amps for these embodiments, however, is still less than the number of read sense amps, i.e. less than the burst length or number of memory cells that are read in a single read operation. Where the number of verify sense amps is greater than one, a verify operation is performed at least partially in a serial manner while one or more memory cells may be verified in parallel.

It should be noted that additional, redundant sense amplifiers may be provided to be used in the event of a manufacturing defect. These redundant sense amplifiers that are not actively used during either a memory read or verify operation are not included in the definition herein of read sense amps and/or verify sense amps.

The mux and other control circuitry 155 operate to control input and output operations for the memory array 125 in conjunction with the read sense amps 145 and the verify sense amp 150 as described in more detail below.

Figure 2:
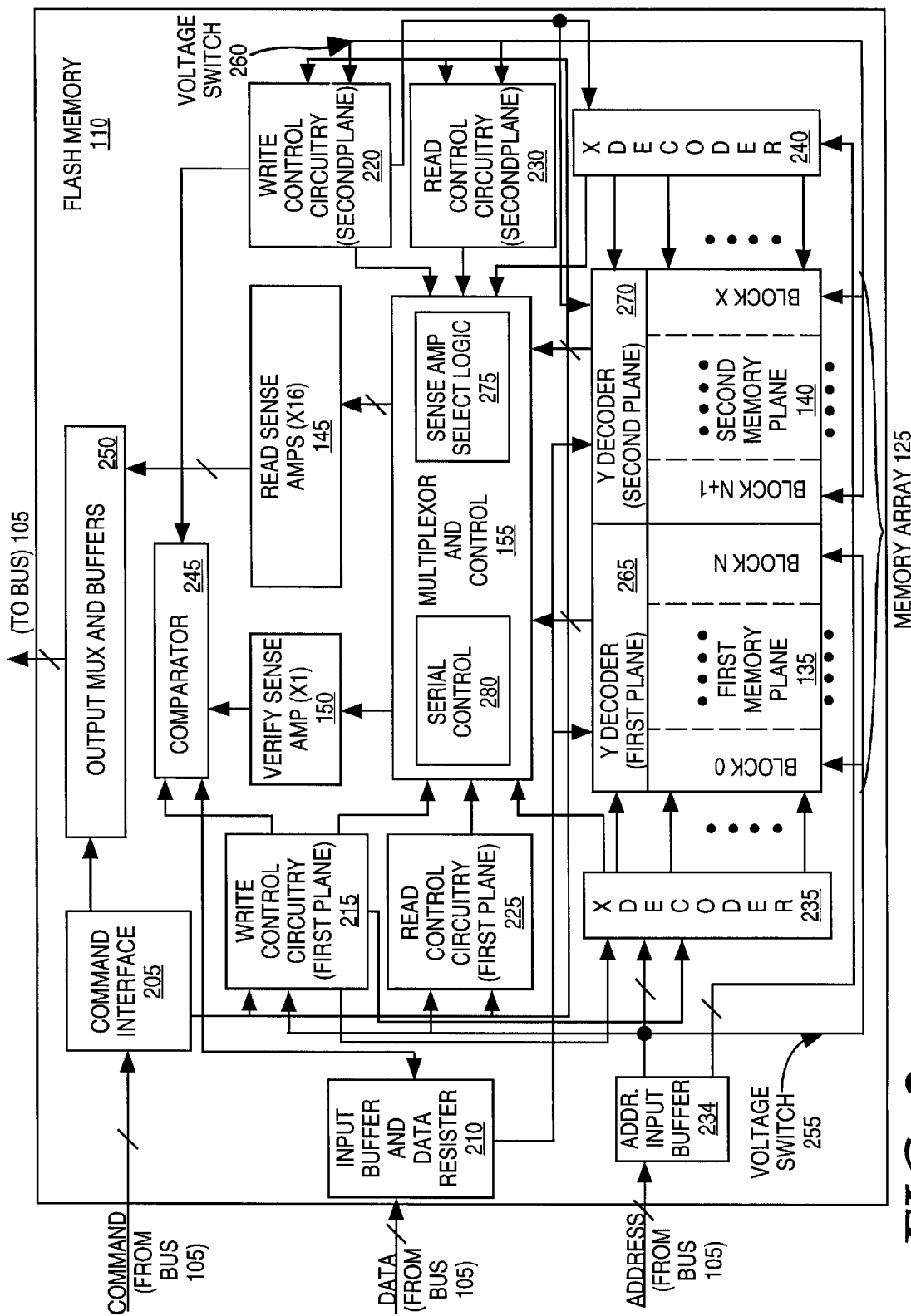
FIG. 2 is a block diagram of the read-while-write flash memory in the system FIG. 1.

FIG. 2 is a block diagram showing the flash memory 110 of one embodiment in more detail. The flash memory 110 includes a command interface 205, input buffers and a data register 210, first and second plane write control circuitry 215 and 220, read control circuitry 225 and 230, and address input and decoding circuitry 235 and 240, the first and second memory planes 135 and 140, multiplexor and control circuitry 155, the verify sense amp 150, read sense amps 145, a comparator 245 and output circuitry including an output multiplexor and output buffers 250. Other circuitry such as additional control circuitry, status registers, and block locking and control circuitry, for example, may also be included in the flash memory 110.

The command interface 205 decodes a command received over the bus 105 from the processor 107 (FIG. 1), for example. The decoded command is used to control other circuitry such as the read control circuitry 225 and 230 and the write control circuitry 215 and 220 to perform the memory operation indicated by the command.

The input buffers and data register 210 are coupled to receive data from the bus 105. The data register 210 is coupled to provide data to the plane 135 or 140 selected to be the write plane, and to the comparator 245 for use in verify operations.

The write control circuitry includes write control circuitry for the first plane 215 and write control circuitry for the second plane 220. The write control circuitry 215 and 220 is coupled to the command interface 205 and controls the operation of memory write and erase operations. The write control circuitry 215 and 220 for one embodiment includes a write state machine to control the sequence of operations for a write operation, and write/erase voltage control circuitry including charge pumps (not shown) to ensure the correct voltage is applied during a write or erase operation. The write control circuitry for the first plane 215 is coupled to the first memory plane 135, and the write control circuitry for the second plane 220 is coupled to the second memory plane 140 over voltage switch buses 255 and 260.

The read control circuitry include s read control circuitry for the first plane 225 and read control circuitry for the second plane 230. The read control circuitry 225 and 230 is also coupled to the command interface 205 and controls the performance of memory read operations. The read control circuitry 225 and 230 similarly includes a read state machine and read voltage control circuitry (not shown).

While the embodiment of FIG. 2 includes first and second plane write and read control circuitry 215, 220, 225 and 230 respectively, other embodiments may only include only one set of write control circuitry and/or one set of read control circuitry. For these embodiments, the write control circuitry may be selectively coupled to the plane selected to be the write plane, and/or the read control circuitry is selectively coupled to the plane selected to be the read plane in response to program/erase and read commands.

The address input buffer is coupled to receive an address from the bus 105. The address input buffer is coupled to X decoders 235 and 240 corresponding to the first and second memory planes 135 and 140 respectively the X decoders 235 and 240 are also coupled to multiplexor and control logic 155. The X decoder 235 is coupled to the first memory plane 135 and to the Y decoder 265 and the X decoder 240 is coupled to the second memory plane 140 and the Y decoder 270. The X decoders 235 and 240 and the Y decoders 265 and 270 are also each coupled to the write control circuitry for the corresponding plane. The X and Y decoders together determine the memory location(s) to be accessed during a read, write, erase or verify operation based on the address (es) received by the address input buffer 234.

The first and second memory planes 135 and 140, as described above, encompass different physical locations in the memory array 125. For one embodiment, each of the first and second memory planes 135 and 140 includes multiple blocks of memory. For example, the first memory plane 135 includes blocks O through N and the second memory plane 140 includes blocks N+1 through X, where N and X can be any integer greater than zero. The use of blocks is particularly advantageous for memory erase operations to enable erasure of one block of memory at a time instead of having to erase the entire memory array 125.

The multiplexor and control circuitry 155 is coupled to receive control signals from the read and write control circuitry 215, 220, 225 and 230, and the X decoders 235 and 240. The multiplexor and control circuitry 155 is also coupled to receive signals to be sensed from the first and second memory planes 135 and 140. The multiplexor and control circuitry 155 includes sense amp select logic 275 in the form of a multiplexor that is responsive to control signals to couple the plane selected to be the read plane to the read sense amps 145 and the write plane to the verify sense amp 150 as described in more detail below. The multiplexor and control logic 155 also includes serial control logic 280 to control the serial coupling of the verify sense amp 150 to different memory locations to be verified in the write plane.

The read sense amps 145 for the embodiment shown in FIG. 2 include sixteen sense amps, one for each column of the memory array 125. The verify sense amp 150 includes a single sense amp as described above.

The comparator 245 is coupled to the verify sense amp 150, the write control circuitry 215 and 220 and the input buffer and data register 210. The comparator 245 is used to compare data to values to be verified in the write plane.

The output mux and buffers 250 are coupled to the read sense amps 145. The output mux and buffers 250 are also coupled to the command interface 205 to receive output enable commands, and are coupled to provide output data from the flash memory 110 to the bus 105.

In operation, a read, write or erase command is received by the command interface 205 from the bus 105. An address corresponding to the read, write or erase command is received from the bus 105 by the address input buffer 234 and decoded by the X and Y decoders 235, 240, 265 and 270 as necessary to determine the memory location(s) to be accessed. Also, if there is any data associated with the command, such as data corresponding to a write command, the data is received by the input buffer and data register 210.

It is assumed for purposes of example that a first command received by the command interface 205 is a write (program) command directed to one or more memory locations in the first plane 135. The write command is decoded by the command interface 205 and the write control circuitry for the first plane 215 is activated. Activation of the write control circuitry for the first plane 215 designates the first memory plane 135 as a write plane, for one embodiment. For another embodiment, the read plane and the write plane may be designated through a separate command prior to operating the memory array 125 in a RWW mode.

The write control circuitry 215 controls the voltage applied to the first memory plane 135 over the voltage switch bus 255 for the various steps of the write operation. This step may involve the use of a charge pump (not shown). Data to be written to the first memory plane 135 is transferred to the indicated memory locations in the first memory plane 135 from the input buffer and data register 210.

Once the programming step is complete, the write control circuitry 215 controls a verify operation to ensure that the desired data was correctly written to the indicated memory location(s). The voltage applied to the first memory plane 135, the write plane in this case, is controlled over the voltage switch bus 255 to perform a verify operation. Also, the write control circuitry 215 controls the sense amp select logic 275 to select the verify sense amp 150 to be coupled to the first memory plane 135. The sense amp select logic 275 is described in more detail below in reference to FIG. 3.

Because the verify sense amp 150 is a single sense amp, the verify operation is performed on the write plane one memory location at a time in a serial manner. The serial control logic 280 controls the serial verify operation to step through the memory locations to be verified one at a time.

The data that was to be programmed in the selected locations of the first memory plane 135 is communicated from the input buffer and data register 210 to the comparator 245. As each memory cell is sensed by the verify sense amp 150, the value stored in the sensed memory cell is compared to the value desired to be programmed in the memory cell using the comparator 245. If each of the locations to be verified is storing the correct data, the write operation is complete. If a memory location to be verified does not include the correct data, the write control circuitry 215 may retry the programming operation for one embodiment.

A verify operation following a memory erase operation is performed in the same manner according to one embodiment as described with reference to the verify operation following a write operation.

Continuing the above example, it is assumed that a memory read command is received by the command interface 205 during execution of the above-described write operation. The address(es) of the memory location(s) to be read are concurrently received by the address input buffer 234 and decoded by the X and Y decoders 235, 240, 265 and 270 as necessary to determine the memory location(s) to be read. Assuming that the address(es) indicate location(s) in the second memory plane 140, the read control circuitry for the second memory plane 230 is activated and the second memory plane 140 is selected to be a read memory plane. The read control circuitry for the second memory plane 230 also controls application of the appropriate read voltage to the second memory plane 140 over the voltage switch bus 260.

For one embodiment, this sequence of commands places the memory 110 in a read-while-write mode such that a read operation can be performed concurrently with a write operation. For other embodiments, another approach may be used to place the memory array 125 in a read-while-write mode. The particular manner in which the memory 110 enters a read-while-write mode is not material to the description of the present invention.

For one embodiment, if the read command indicates a memory location in the first memory plane 135 which has been designated as a write plane as described above, the write operation is suspended while the read operation is performed. For another embodiment, the read command fails or is stalled pending completion of the write operation.

With continuing reference to FIG. 2, the read control circuitry 230 further operates to control the sense amp select logic 275 to couple the read sense amps 145 to the second memory plane 140. For another embodiment, once the verify sense amp 150 has been selectively coupled to one of the first 135 or second 140 memory planes, the read sense amps 145 are coupled to the other plane.

Figure 3:
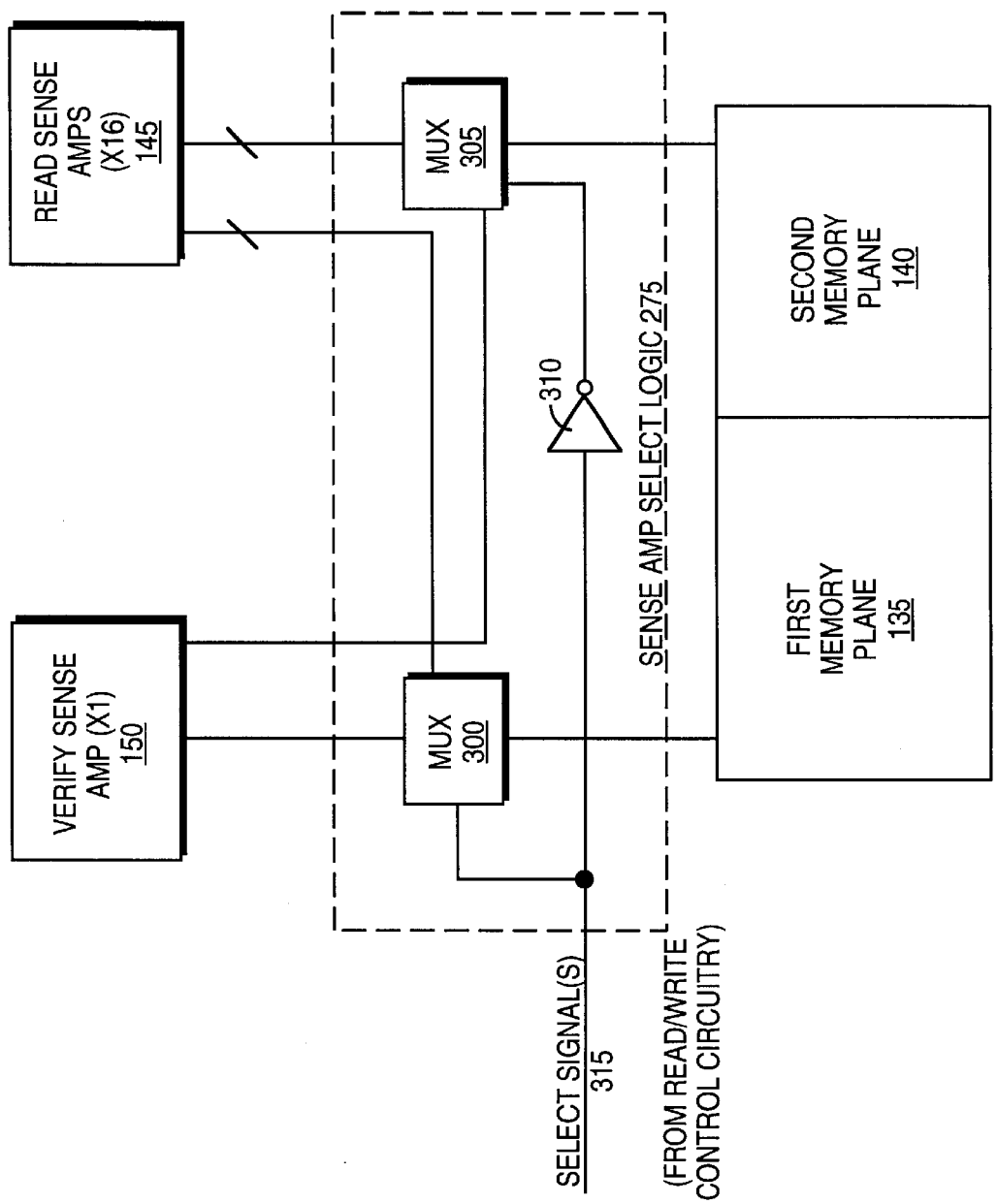
FIG. 3 is a diagram of the sense amplifier select logic of the flash memory of FIG. 2.

FIG. 3 shows the sense amp select logic 275 of one embodiment in more detail. The sense amp select logic 275 includes a first multiplexor (mux) 300, a second mux 305 and an inverter 310. The mux 300 is coupled to the first memory plane 135 and to both the verify sense amp 150 and the read sense amps 145. The mux 305 is coupled to the second memory plane 140, the inverter 310, and also to both the verify sense amp 150 and the read sense amps 145. One or more select signals are communicated to a select input of the mux 300 and to an input of the inverter 310 such that an inverted signal is received by the mux 305.

The select signal(s) 315 of one embodiment is asserted by the write control circuitry 215 or 220 and the corresponding plane in the memory array 125 is selected to be the write plane. For one embodiment, a logical high select signal(s) 315 indicates that the first memory plane 135 is the write plane and causes mux 300 to couple the verify sense amp 150 to the first memory plane. The second memory plane 140 is then automatically coupled to the read sense amps 145. The sense amp select logic may be implemented in another manner for other embodiments and the control signals used for selection may be from another source.

Referring back to FIG. 2, once the read sense amps 145 are coupled to the second memory plane 140, 16 memory cells are read in parallel until all of the desired locations of read plane have been read. This is referred to as a "by 16" read. The information read from the memory array 125 is then provided to the bus 105 through the output multiplexor and output buffers 250.

By reading 16 memory cells in parallel, the read operation performance is not compromised. The performance penalty incurred by performing a verify operation in a serial manner is only a small portion of the overall erase or write cycle time and therefore, has only a minor impact on overall performance.

The use of a single sense amplifier for performing memory write or erase verify operations provides the advantage of reducing the space required to implement read-while-write capabilities in a memory. Further, using a single sense amplifier for performance of memory write or erase verify operations reduces the peak power requirements for performing read and write or erase operations concurrently by having fewer sense amplifiers operating at one time for RWW operations.

The use of a multiple sense amplifiers for performing read operations while using a single sense amplifier for write and erase verify operations also strikes a balance between the need to perform read operations quickly in response to processor requests and the need to minimize space and power consumption. Read operations are speed critical in order to avoid stalling the processor. Further a read cycle typically requires a much shorter latency than a write or erase cycle. Thus, it is advantageous to continue to be able to perform read operations on multiple memory cells, usually an entire row of memory, in parallel. In this manner, read performance is not compromised.

In contrast, performing the write or erase verify operations in a serial manner using a single sense amp as opposed to a parallel manner has a relatively small impact on memory program performance. The latency required for performance of memory write and erase operations is much higher than that required for memory read operations. Also, the verify operation is only one part of the memory write or erase operations. Consequently, using a single sense amp to perform the verify portion of a write or erase operation has a relatively minor impact on overall write and erase performance.

Figure 4:
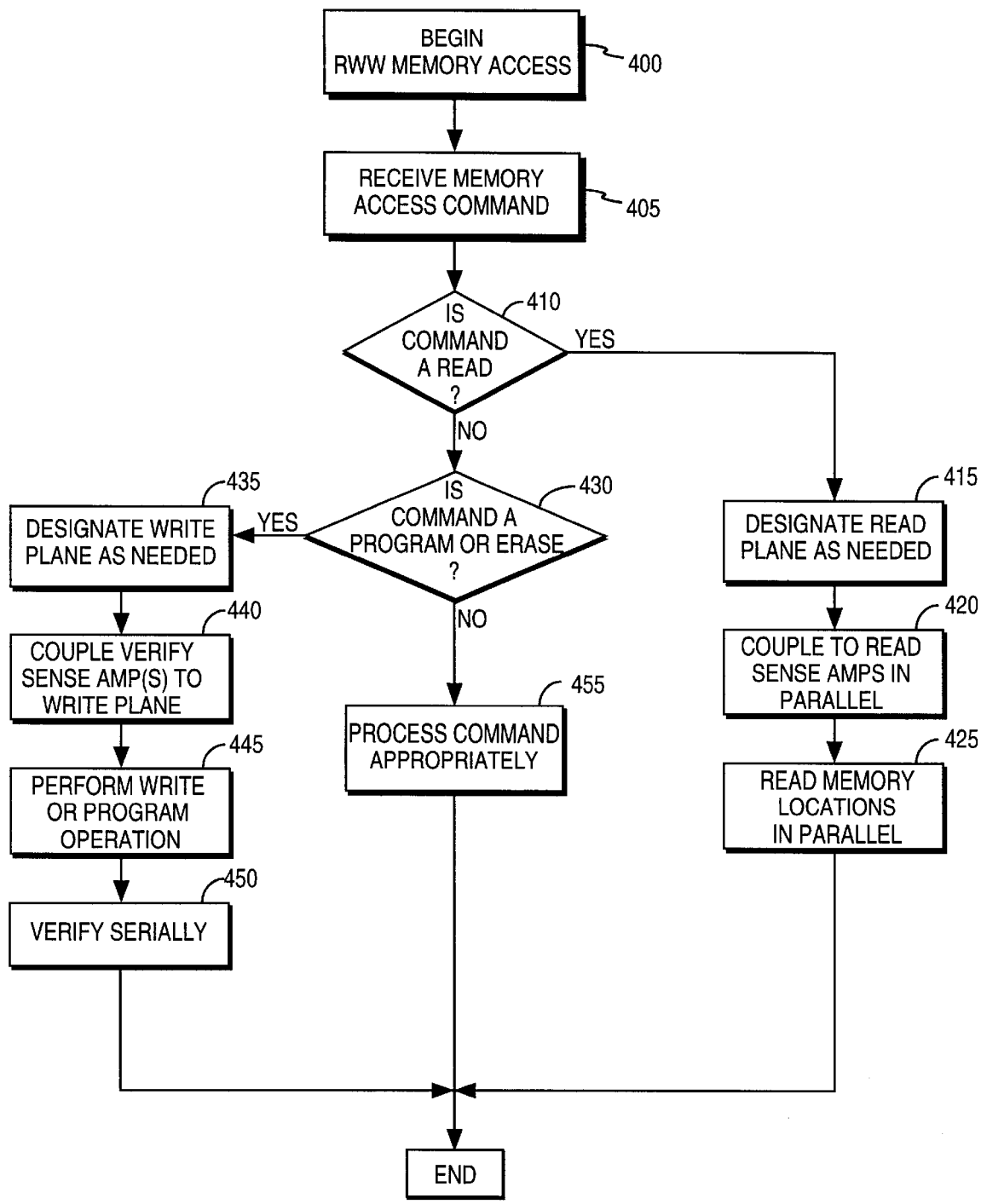
FIG. 4 is a flow diagram showing the read-while-write memory access method of one embodiment.

FIG. 4 is a flow diagram illustrating the method of one embodiment beginning at step 400. At step 405, a memory access command is received by the memory to be accessed from a processor or other source. At decision block 410, it is determined whether the memory access command is a read command. If so, then at step 415, the memory plane to which the memory access command is directed is designated and configured as a read plane. In some cases this step may not need to be performed. For example, memory read and/or write planes may have been previously designated by a separate command or by a previous memory access command.

At step 420, the read plane is coupled to read sense amps in parallel. At step 425, multiple memory locations are read in parallel. The number of memory locations read in parallel is the same as the number of read sense amps which for one embodiment, is the maximum number of memory cells that can be read internally in one read cycle.

Referring back to decision block 410, if the memory access command is not a read command, then in decision block 430, it is determined whether the memory access command is a memory write or program command. If so, then at step 435, the plane to which the write or erase command is directed is designated and configured as a write plane. Again, this step may not be necessary if the write plane has been designated and configured previously.

At step 440, a verify sense amp is coupled to the write plane. At step 445, the write or erase operation is performed and at step 450, the memory cells that have been programmed or erased are verified one at a time in a serial manner. For other embodiments, more than one verify sense amplifier may be used but the number of verify sense amps will be less than the number of read sense amps such that some part of the verify operation is performed serially (for a same number of memory cells as are read in one cycle using the read sense amps). Performance of the read command and performance of the write or erase command may be concurrent.

Referring back to decision block 430, if the command is not a program or erase command, then in step 455, the command is performed appropriately.

For other embodiments, the method may include additional steps such as handling read commands directed to a write plane and vice versa.

In the foregoing specification, the invention has been described with reference to specific exemplary embodiments. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A read-while-write (RWW) memory device comprising:
   a memory array including a read memory plane and a write memory plane;
   a first number of read sense amplifiers to be coupled in parallel to the read memory plane in response to a memory read operation, the first number being greater than one; and
   a second number of verify sense amplifiers to be coupled to the write memory plane in response to one of a memory write or erase operation, the verify sense amplifiers being different than the read sense amplifers and the second number being greater than zero and less than the first number.

2. The memory device of claim 1 wherein the memory array is divided into first and second physical memory planes, and wherein for each memory access operation, one of the first or second memory planes is selectable to be the read memory plane and the other to be the write memory plane.

3. The memory device of claim 1 wherein the first number is equal to a read burst length for the memory device.

4. The memory device of claim 3 wherein the second number is equal to one.

5. The memory device of claim 1 wherein the second number is equal to one.

6. The memory device of claim 5 wherein, during a memory read operation, values stored in the first number of memory cells are read in parallel and, during a verify operation following a memory write or erase operation, a value in each memory cell to be verified is verified in a serial manner, memory location by memory location.

7. The memory device of claim 1 wherein the memory array is a flash memory array.

8. The memory device of claim 1 further including sense amplifier select logic, the sense amplifier select logic to couple the read sense amplifiers to the read plane in response to the read operation and the verify sense amplifier(s) to the write plane in response to one of the memory erase or write operation.

9. The memory device of claim 1 further including serial control logic coupled to the verify sense amplifier(s), the serial control logic to control coupling the verify sense amplifier(s) to the write plane in a serial manner for a portion of a verify operation following one of the memory write or erase operations.

10. A read-while-write (RWW) memory comprising:
    an array of memory cells divided into a read plane and a write plane, the physical locations of the read plane and the write plane in the memory array to alternate in response to memory access operations;
    a first number of read sense amplifiers to be coupled in parallel to the read plane in response to a memory read operation, the first number being equal to the burst length for the RWW memory; and
    a second number of verify sense amplifiers to be coupled to the write plane in response to one of a memory write verify operation or a memory erase verify operation, the verify sense amplifiers being different than the read sense amplifers and the second number being less than the first number.

11. The RWW memory of claim 10 wherein the array of memory cells is a flash memory array.

12. The RWW memory of claim 10 wherein the second number is one.

13. The RWW memory of claim 12 wherein the first number of memory cells is read in parallel during a read operation and the verify operation is performed one memory cell at a time.

14. The RWW memory of claim 10 further including sense amplifier select logic coupled to the read and verify sense amplifiers, the sense amplifier select logic to couple the first number of read sense amplifiers to the read plane in response to the read operation.

15. The RWW memory of claim 10 further including sense amplifier select logic coupled to the read and verify sense amplifiers, the sense amplifier select logic to couple the verify sense amplifier(s) to the write plane in response to one of the write or erase verify operations.

16. A method for performing memory access operations in a read-while-write (RWW) memory comprising:
receiving a first command;
if the first command is a memory read command, reading a first number of memory locations in parallel, the first number being greater than one; and
if the first command is one of a memory write or erase command, verifying in a serial manner, memory location by memory location, each memory location to be verified following processing of the write or erase command.

17. The method of claim 16 wherein the first number is equal to a burst length for the RWW memory.

18. The method of claim 16 wherein reading includes:
designating a read plane in the RWW memory; and
coupling the first number of sense amplifiers in parallel to the read plane.

19. The method of claim 16 wherein verifying includes:
designating a write plane in the RWW memory;
performing the write or erase operation; and
coupling a single verify sense amplifier to a write plane.

20. A method for performing memory access operations in a read-while-write (RWW) memory, the method comprising:
reading values stored in a plurality of memory cells in parallel in response to a memory read operation directed to a read plane of the memory; and
verifying a value stored in a plurality of memory cells one memory cell at a time in response to one of a memory erase or write operation directed to a write plane of the memory.

21. The method of claim 20 wherein reading includes selectively coupling read sense amplifiers to the read plane and verifying includes selectively coupling a verify sense amplifier to the write plane.

22. The method of claim 20 wherein reading and verifying are performed concurrently.

23. A system comprising:
a bus;
a processor coupled to the bus; and
a read-while-write (RWW) memory coupled to the bus and accessible by the processor in response to one of a memory read, write or erase operation, the memory including:
an array of memory cells including a read memory plane and a write memory plane,
a first number of read sense amplifiers to be coupled in parallel to the read memory plane in response to a memory read operation, the first number being greater than one; and
a second number of verify sense amplifiers to be coupled to the write memory plane in response to one of a memory erase or write operation, the verify sense amplifiers being different than the read sense amplifers and the second number being greater than zero and less than the first number.

24. The system of claim 23 wherein the first number is equal to a burst length for the RWW memory and the second number is one.

25. The system of claim 23 wherein the location of the read memory plane in the memory array is selectable in response to a memory read operation and the location of the write memory plane in the memory array is selectable in response to a memory write or erase operation.

* * * * *